US012332326B2

(12) United States Patent
Higashi et al.

(10) Patent No.: US 12,332,326 B2
(45) Date of Patent: Jun. 17, 2025

(54) SENSOR AND INSPECTION DEVICE

(71) Applicant: KABUSHIKI KAISHA TOSHIBA, Tokyo (JP)

(72) Inventors: Yoshihiro Higashi, Komatsu Ishikawa (JP); Akira Kikitsu, Yokohama Kanagawa (JP); Satoshi Shirotori, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 301 days.

(21) Appl. No.: 18/174,211

(22) Filed: Feb. 24, 2023

(65) Prior Publication Data
US 2024/0077550 A1  Mar. 7, 2024

(30) Foreign Application Priority Data
Sep. 1, 2022 (JP) ................................ 2022-139311

(51) Int. Cl.
*G01R 33/035* (2006.01)
(52) U.S. Cl.
CPC ............................. *G01R 33/0354* (2013.01)
(58) Field of Classification Search
CPC ............. G01R 33/0354; G01R 33/093; G01R 33/0094
See application file for complete search history.

(56) References Cited

U.S. PATENT DOCUMENTS 8,242,776 B2 * 8/2012 Mather ................ G01R 33/093
324/245
9,568,566 B2 * 2/2017 Paci ...................... G01R 33/096
(Continued)

FOREIGN PATENT DOCUMENTS

JP   2019-207167 A   12/2019
JP   2021-145021 A    9/2021
(Continued)

OTHER PUBLICATIONS

Andre Guedes et al., "Hybrid GMR Sensor Detecting 950 pT/sqrt(Hz) at 1 Hz and Room Temperature," Sensors, vol. 18, Art. 790, 8 pages, doi:10.3390/s18030790 (2018).
(Continued)

*Primary Examiner* — Reena Aurora
(74) *Attorney, Agent, or Firm* — Finnegan, Henderson, Farabow, Garrett & Dunner, LLP

(57) ABSTRACT

According to one embodiment, a sensor includes an element portion. The element portion includes a first magnetic element, a second magnetic element, a first conductive member, and a second conductive member. The first magnetic element includes a first end portion and a first other end portion. A direction from the first end portion to the first other end portion is along a first direction. The second magnetic element includes a second end portion and a second other end portion. A direction from the second end portion to the second other end portion is along the first direction. The first conductive member includes a first portion, a first other portion, a second portion, and a second other portion. The second conductive member includes a first conductive portion, a first other conductive portion, a second conductive portion, and a second other conductive portion.

20 Claims, 9 Drawing Sheets

(56) References Cited

U.S. PATENT DOCUMENTS

| | | | |
|---|---|---|---|
| 11,237,230 B1* | 2/2022 | Iwasaki | G01R 33/093 |
| 11,815,570 B2* | 11/2023 | Iwasaki | G01R 33/09 |
| 2019/0369172 A1 | 12/2019 | Kikitsu et al. | |
| 2021/0286029 A1 | 9/2021 | Higashi et al. | |
| 2022/0065955 A1 | 3/2022 | Kikitsu et al. | |

FOREIGN PATENT DOCUMENTS

| | | |
|---|---|---|
| JP | 2022-37688 A | 3/2022 |
| JP | 2022-41644 A | 3/2022 |

OTHER PUBLICATIONS

Long Pan et al., "Novel Magnetic Field Modulation Concept Using Multiferroic Heterostructure for Magnetoresistive Sensors," Sensors, vol. 20, Art. 1440, 13 pages, doi:10.3390/s20051440 (2020).

\* cited by examiner

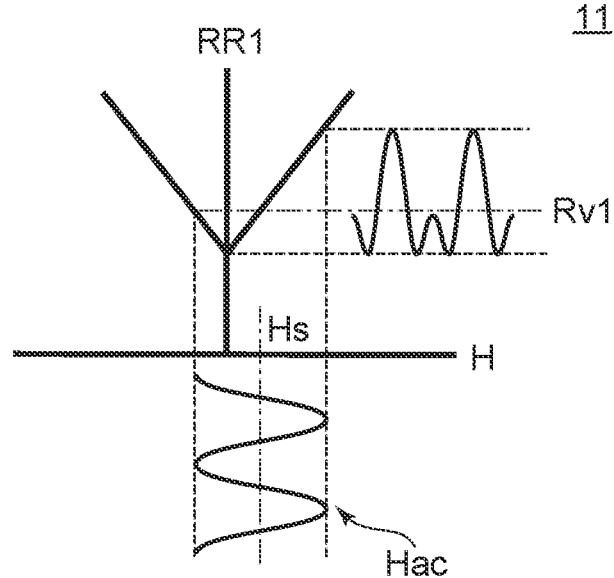
FIG. 4A
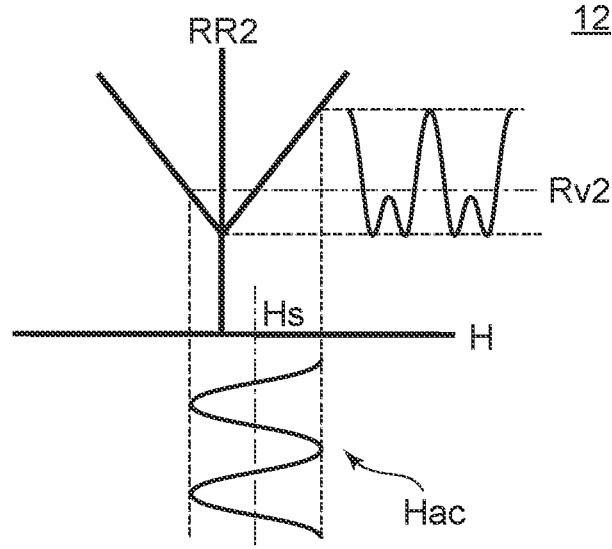
FIG. 4B
FIG. 4C

SENSOR AND INSPECTION DEVICE

CROSS-REFERENCE TO RELATED APPLICATIONS

This application is based upon and claims the benefit of priority from Japanese Patent Application No. 2022-139311, filed on Sep. 1, 2022; the entire contents of which are incorporated herein by reference.

FIELD

Embodiments described herein generally relate to a sensor and an inspection device.

BACKGROUND

For example, there is a sensor using a magnetic layer. Noise suppression is desirable in sensors.

BRIEF DESCRIPTION OF THE DRAWINGS

FIGS. 4A to 4C are schematic diagrams illustrating the operation of the sensor according to the first embodiment;

DETAILED DESCRIPTION

Figure 1A:
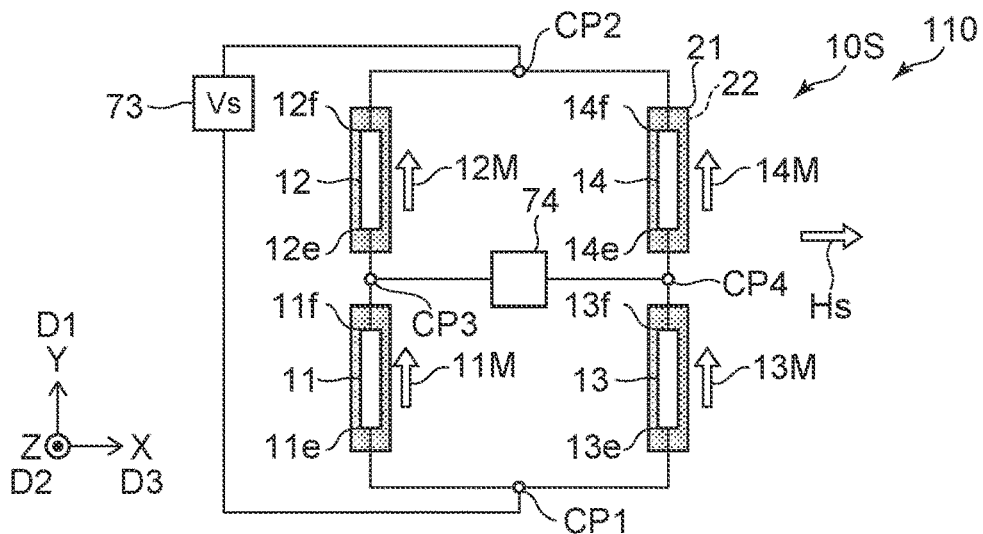
FIGS. 1A to 1C are schematic plan views illustrating a sensor according to a first embodiment.

According to one embodiment, a sensor includes an element portion. The element portion includes a first magnetic element, a second magnetic element, a first conductive member, and a second conductive member. The first magnetic element includes a first end portion and a first other end portion. A direction from the first end portion to the first other end portion is along a first direction. The second magnetic element includes a second end portion and a second other end portion. A direction from the second end portion to the second other end portion is along the first direction. The first other end portion is electrically connected to the second end portion. The first conductive member includes a first portion, a first other portion, a second portion, and a second other portion. The first portion corresponds to the first end portion, the first other portion corresponds to the first other end portion, the second portion corresponds to the second end portion, and the second other portion corresponds to the second other end portion. The first other portion is electrically connected to the second portion. The second conductive member includes a first conductive portion, a first other conductive portion, a second conductive portion, and a second other conductive portion. The first conductive portion corresponds to the first end portion, the first other conductive portion corresponds to the first other end portion, the second conductive portion corresponds to the second end portion, and the second other conductive portion corresponds to the second other end portion. The first other conductive portion is electrically connected to the second conductive portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

Figure 1B:
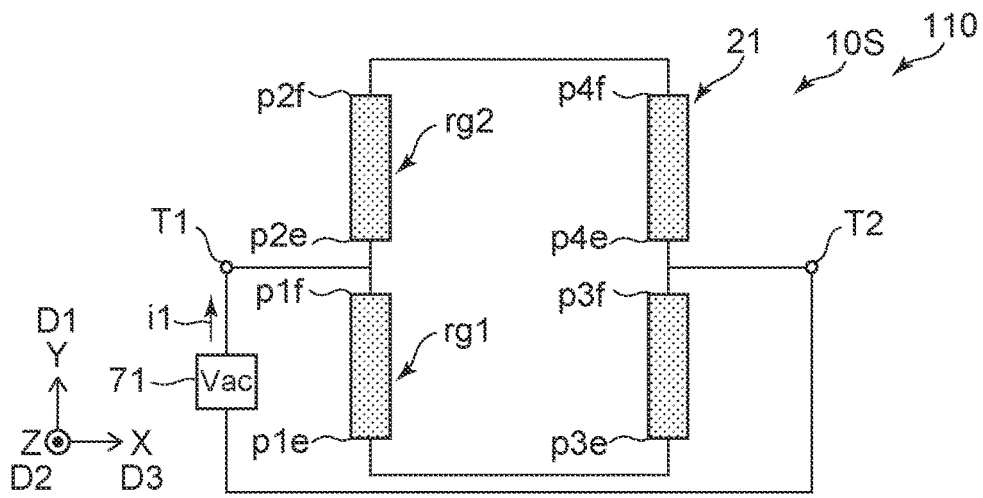
Figure 1C:
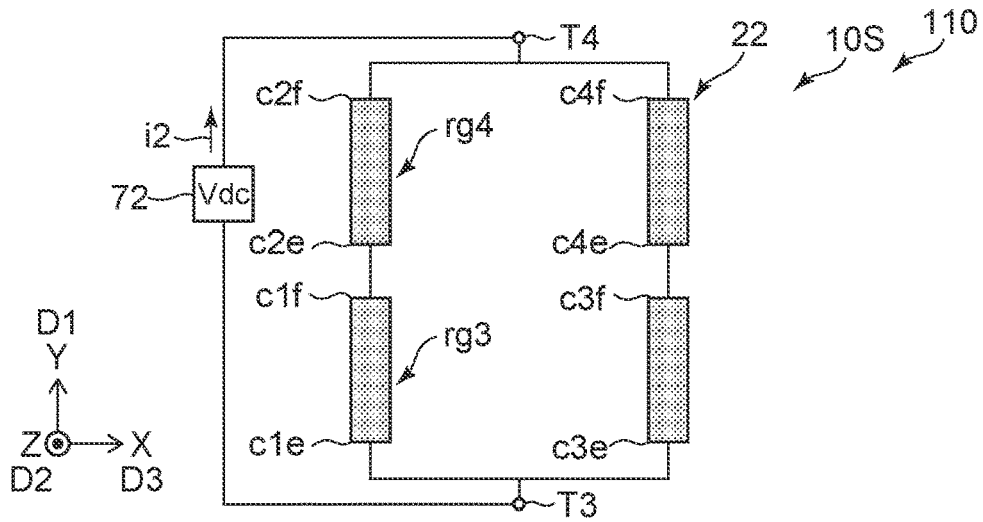

FIGS. 1A to 1C are schematic plan views illustrating a sensor according to the first embodiment.

FIGS. 2A to 2D and FIGS. 3A to 3D are schematic cross-sectional views illustrating the sensor according to the first embodiment.

In FIGS. 1B and 1C, some elements are extracted and illustrated.

As shown in FIG. 1A, a sensor 110 according to the embodiment includes an element portion 10S. The element portion 10S includes a first magnetic element 11, a second magnetic element 12, a first conductive member 21 and a second conductive member 22. The element portion 10S may further include a third magnetic element 13 and a fourth magnetic element 14. The third magnetic element 13 and the fourth magnetic element 14 will be described later.

As shown in FIG. 1A, the first magnetic element 11 includes a first end portion 11$e$ and a first other end portion 11$f$. A direction from the first end portion 11$e$ to the first other end portion 11$f$ is along a first direction D1.

The first direction D1 is defined as a Y-axis direction. One direction perpendicular to the Y-axis direction is defined as a Z-axis direction. The direction perpendicular to the Y-axis direction and the Z-axis direction is defined as an X-axis direction.

The second magnetic element 12 includes a second end portion 12$e$ and a second other end portion 12$f$. A direction from the second end portion 12$e$ to the second other end portion 12$f$ is along the first direction D1. The first other end portion 11$f$ is electrically connected to the second end portion 12$e$.

As shown in FIG. 1A, the first conductive member 21 and the second conductive member 22 overlap the first magnetic element 11 and the second magnetic element 12.

FIG. 1B illustrates the first conductive member 21. The first conductive member 21 includes a first portion p1$e$, a first other portion p1$f$, a second portion p2$e$ and a second other portion p2$f$. The first portion p1$e$ corresponds to the first end portion 11$e$. The first other portion p1$f$ corresponds to the first other end portion 11$f$. The second portion p2$e$ corresponds to the second end portion 12$e$. The second other portion p2$f$ corresponds to the second other end portion 12$f$. The first other portion p1$f$ is electrically connected to the second portion p2$e$. The first other portion p1$f$ may be continuous with the second portion p2$e$.

FIG. 1C illustrates the second conductive member 22. The second conductive member 22 includes a first conductive portion c1e, a first other conductive portion c1f, a second conductive portion c2e, and a second other conductive portion c2f. The first conductive portion c1e corresponds to the first end portion 11e. The first other conductive portion c1f corresponds to the first other end portion 11f. The second conductive portion c2e corresponds to the second end portion 12e. The second other conductive portion c2f corresponds to the second other end portion 12f. The first other conductive portion c1f is electrically connected to the second conductive portion c2e. The first other conductive portion c1f may be continuous with the second conductive portion c2e.

As shown in FIGS. 2A, 2B, 3A, and 3B, for example, a second direction D2 from the first conductive member 21 to the first magnetic element 11 and the second magnetic element 12 crosses the first direction D1. The second direction D2 is, for example, the Z axis direction.

As shown in FIGS. 2A, 2B, 3A and 3B, for example, the direction from the second conductive member 22 to the first magnetic element 11 and the second magnetic element 12 is along the second direction D2.

As shown in FIGS. 1B and 1C, a first current i1 can be supplied to the first conductive member 21 and a second current i2 can be supplied to the second conductive member 22. The relative directions of these currents are opposite in the first magnetic element 11 and the second magnetic element 12. Thereby, the detection target magnetic field Hs can be detected by suppressing noise. According to an embodiment, a sensor capable of suppressing noise can be provided.

For example, as shown in FIG. 1B, the element portion 10S may include a first terminal T1 and a second terminal T2. The first terminal T1 is electrically connected to the first other portion p1f and the second portion p2e. The second terminal T2 is electrically connected to the first portion p1e and the second other portion p2f. In this example, the second terminal T2 is electrically connected to the first portion p1e and the second other portion p2f via the third magnetic element 13 and the fourth magnetic element 14, which will be described later.

For example, as shown in FIG. 1C, the element portion 10S may include a third terminal T3 and a fourth terminal T4. The third terminal T3 is electrically connected to the first conductive portion c1e. The fourth terminal T4 is electrically connected to the second other conductive portion c2f.

As shown in FIG. 1B, the first current i1 can be supplied between the first terminal T1 and the second terminal T2. The first current i1 includes an AC component. For example, the sensor 110 may include a first circuit 71 that supplies the first current i1 to the first conductive member 21. For example, the first circuit 71 may apply an AC voltage Vac between the first terminal T1 and the second terminal T2.

As shown in FIG. 1C, the second current i2 can be supplied between the third terminal T3 and the fourth terminal T4. The second current i2 includes, for example, a direct current component. The sensor 110 may include a second circuit 72 that supplies the second current i2 to the second conductive member 22. For example, the second circuit 72 may apply a DC voltage Vdc between the third terminal T3 and the fourth terminal T4.

For example, when the first current i1 flows from the first terminal T1 to the second terminal T2, the second current i2 flows from the third terminal T3 to the fourth terminal T4 or from the fourth terminal T4 to the third terminal T3.

The relationship between the orientation of the first current i1 and the orientation of the second current i2 is reversed at a position corresponding to the first magnetic element 11 and a position corresponding to the second magnetic element 12. As a result, as will be described later, magnetic field by these currents acts in a canceling direction.

As shown in FIGS. 1B, 2A, 2B, 3A and 3B, the first conductive member 21 includes a first region rg1 and a second region rg2. The first region rg1 overlap the first magnetic element 11. The second region rg2 overlaps the second magnetic element 12. For example, the first region rg1 overlaps the first magnetic element 11 in the second direction D2. The second region rg2 overlaps the second magnetic element 12 in the second direction D2.

As shown in FIGS. 1C, 2A, 2B, 3A and 3B, the second conductive member 22 includes a third region rg3 and a fourth region rg4. The third region rg3 overlaps the first magnetic element 11. The fourth region rg4 overlaps the second magnetic element 12. For example, the third region rg3 overlaps the first magnetic element 11 in the second direction D2. The fourth region rg4 overlaps the second magnetic element 12 in the second direction D2.

As described above, the first current i1 can be supplied to the first conductive member 21. The second current i2 can be supplied to the second conductive member 22. When the orientation of the first current i1 flowing in the first region rg1 is the same as the orientation of the second current i2 flowing in the third region rg3, the orientation of the first current i1 flowing in the second region rg2 is opposite to the orientation of the second current i2 flowing in the fourth region rg4.

Such first current i1 and second current i2 are supplied, and magnetic field based on these currents is applied to the first magnetic element 11 and the second magnetic element 12. The detection target magnetic field Hs is further applied to these magnetic elements.

The first electrical resistance of the first magnetic element 11 can be changed according to the detection target magnetic field Hs. The second electrical resistance of the second magnetic element 12 can be changed according to the detection target magnetic field Hs.

The detection target magnetic field Hs includes, for example, a component along the third direction D3. The third direction D3 crosses a plane including the first direction D1 and the second direction D2. The third direction D3 is, for example, the X-axis direction.

As shown in FIG. 1A, the sensor 110 may further include a third circuit 73 and a fourth circuit 74. The third circuit 73 is configured to supply a detection voltage Vs or a detection current between the first connection point CP1 and the second connection point CP2. The detection current flows by the detection voltage Vs. The first connection point CP1 is electrically connected to the first end portion 11e. The second connection point CP2 is electrically connected to the second other end portion 12f.

The fourth circuit 74 is configured to output a value corresponding to changes in the potential of the third connection point CP3. The third connection point CP3 is a connection point between the first other end portion 11f and the second end portion 12e. The change in the potential of the third connection point CP3 corresponds to a change in the first electrical resistance of the first magnetic element 11. The change in the potential of the third connection point CP3 corresponds to a change in the second electrical resistance of the second magnetic element 12. The detection target magnetic field Hs can be detected by detecting the value corresponding to the change in the potential of the third connection point CP3.

Figure 2A:
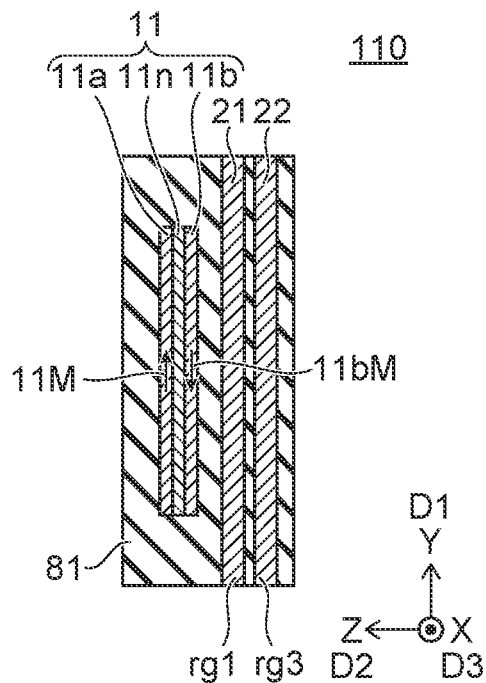
FIGS. 2A to 2D are schematic cross-sectional views illustrating the sensor according to the first embodiment.
Figure 3A:
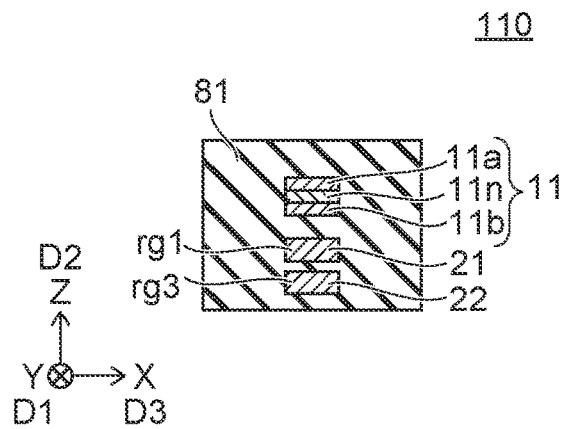
FIGS. 3A to 3D are schematic cross-sectional views illustrating the sensor according to the first embodiment.

The electrical resistance of the magnetic element responds to changes in the orientation of magnetization of the magnetic layers included in the magnetic element. As shown in FIGS. 2A and 3A, the first magnetic element 11 includes a first magnetic layer 11a. In this example, the first magnetic element 11 further includes a first opposing magnetic layer 11b and a first non-magnetic layer 11n. The first non-magnetic layer 11n is provided between the first magnetic layer 11a and the first opposing magnetic layer 11b.

In this example, the first opposing magnetic layer 11b is located between the first conductive member 21 and the first magnetic layer 11a. The order of the first conductive member 21, the first magnetic layer 11a and the first opposing magnetic layer 11b may be arbitrary.

For example, the first magnetic layer 11a is a magnetization reference layer, and the first opposing magnetic layer 11b is a magnetization free layer. The first magnetic layer 11a may be a magnetization free layer, and the first opposing magnetic layer 11b may be a magnetization reference layer. Hereinafter, the first magnetic layer 11a is the magnetization reference layer and the first opposing magnetic layer 11b is the magnetization free layer. The magnetization 11bM of the first opposing magnetic layer 11b changes more easily than the first magnetization 11M of the first magnetic layer 11a.

As shown in FIGS. 1A and 2A, the first magnetization 11M of the first magnetic layer 11a includes a first component in a first orientation. The first orientation is along the orientation from the first end portion 11e to the first other end portion 11f or the orientation from the first other end portion 11f to the first end portion 11e. In this example, the first orientation is along the orientation from the first end portion 11e to the first other end portion 11f.

The orientation of the magnetization 11bM of the first opposing magnetic layer 11b changes according to the magnetic field from the outside. This changes the angle between the magnetization 11bM and the first magnetization 11M. The change in the first electrical resistance depends, for example, on a change in the angle between these magnetizations. The magnetic field from the outside includes the detection target magnetic field Hs, the magnetic field based on the first current i1, and the magnetic field based on the second current i2.

Figure 2B:
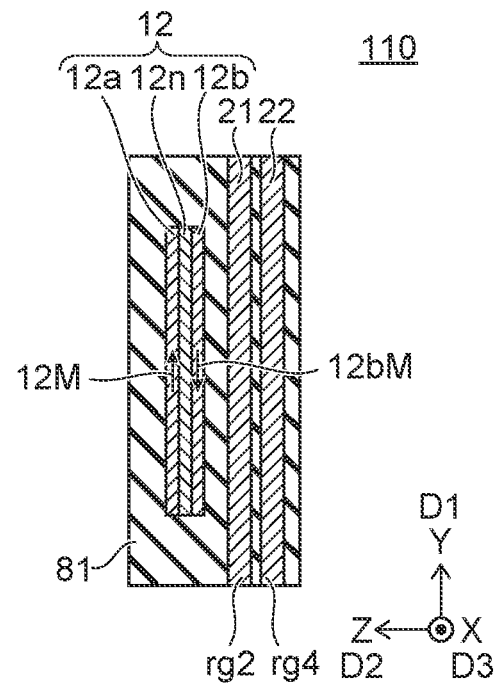
Figure 3B:
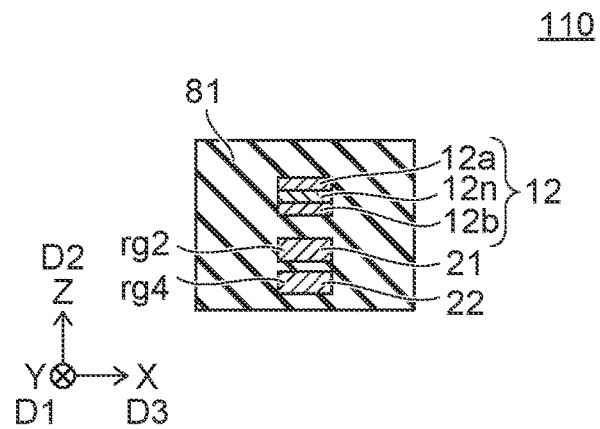

As shown in FIGS. 2B and 3B, the second magnetic element 12 includes a second magnetic layer 12a. In this example, the second magnetic element 12 further includes a second opposing magnetic layer 12b and a second non-magnetic layer 12n. The second non-magnetic layer 12n is provided between the second magnetic layer 12a and the second opposing magnetic layer 12b.

In this example, the second opposing magnetic layer 12b is located between the first conductive member 21 and the second magnetic layer 12a. The order of the first conductive member 21, the second magnetic layer 12a and the second opposing magnetic layer 12b may be arbitrary.

For example, the second magnetic layer 12a is a magnetization reference layer, and the second opposing magnetic layer 12b is a magnetization free layer. The second magnetic layer 12a may be a magnetization free layer, and the second opposing magnetic layer 12b may be a magnetization reference layer. In the following, the second magnetic layer 12a is the magnetization reference layer and the second opposing magnetic layer 12b is the magnetization free layer. The magnetization 12bM of the second opposing magnetic layer 12b changes more easily than the second magnetization 12M of the second magnetic layer 12a.

As shown in FIGS. 1A and 2B, the second magnetization 12M of the second magnetic layer 12a includes a second component in the first orientation.

The orientation of the magnetization 12bM of the second opposing magnetic layer 12b changes according to the magnetic field from the outside. This changes the angle between the magnetization 12bM and the second magnetization 12M. The change in the second electrical resistance depends on, for example, a change in the angle between these magnetizations. The magnetic field from the outside includes the detection target magnetic field Hs, the magnetic field based on the first current i1, and the magnetic field based on the second current i2.

The first magnetic element 11 and the second magnetic element 12 are, for example, GMR (Giant Magneto Resistive effect) elements.

As described above, the first current i1 includes an AC component. The AC magnetic field based on the first current i1 functions as a carrier signal for detecting the detection target magnetic field Hs. The shift to high frequencies using the AC magnetic field is used. This suppresses influence of 1/f noise.

Examples of the first electrical resistance of the first magnetic element 11 and the second electrical resistance of the second magnetic element 12 will be described below.

FIGS. 4A to 4C are schematic diagrams illustrating the operation of the sensor according to the first embodiment.

FIG. 4A corresponds to the first magnetic element 11. FIG. 4B corresponds to the second magnetic element 12. The horizontal axis of these figures is the strength of the external magnetic field H applied to the magnetic element. The vertical axis of FIG. 4A is the first electrical resistance RR1 of the first magnetic element 11. The vertical axis of FIG. 4B is the second electrical resistance RR2 of the second magnetic element 12.

As shown in FIG. 4A, the first electrical resistance RR1 changes with respect to the magnetic field H as an even function. As shown in FIG. 4B, the second electrical resistance RR2 changes with respect to the magnetic field H as an even function.

As shown in FIG. 4A, the magnetic field H includes the detection target magnetic field Hs and the AC magnetic field Hac based on the first current i1. With respect to such the magnetic field H, the first electrical resistance RR1 changes with a first resistance change Rv1.

As shown in FIG. 4B, the magnetic field H includes the detection target magnetic field Hs and the AC magnetic field Hac based on the first current i1. With respect to such the magnetic field H, the second electrical resistance RR2 changes with a second resistance change Rv2.

As described with reference to FIG. 1B, the orientation of the first current i1 flowing through the first region rg1 corresponding to the first magnetic element 11 is opposite to the orientation of the first current i1 flowing through the second region rg2 corresponding to the second magnetic element 12. Therefore, the phase of the AC magnetic field Hac applied to the second magnetic element 12 is shifted by 180 degrees from the phase of the AC field Hac applied to the first magnetic element 11. The AC magnetic field Hac having an opposite phase is applied to the first magnetic element 11 and the second magnetic element 12.

FIG. 4C schematically shows the first resistance change Rv1 and the second resistance change Rv2. As shown in FIG. 4C, the effect of the AC field Hac is canceled by the synthesis (e.g., difference) of the first resistance change Rv1 and the second resistance change Rv2. For example, the suppression of the influence of 1/f noise by shifting to high frequency using the AC magnetic field Hac (carrier signal) can be effectively utilized.

Further, it has been found that the noise caused by the magnetic field based on the second current i2 can be suppressed. This characteristic will be described below. Hereinafter, the characteristics of the case where the magnetic field by the second current i2 flowing through the second conductive member 22 is applied to one magnetic element (for example, the first magnetic element 11) will be described.

Figure 5A:
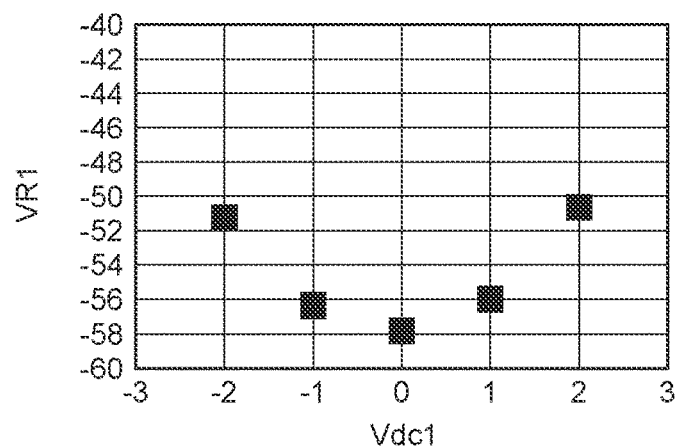
FIGS. 5A to 5C are schematic diagrams illustrating operations in the sensor according to the first embodiment.
Figure 5B:
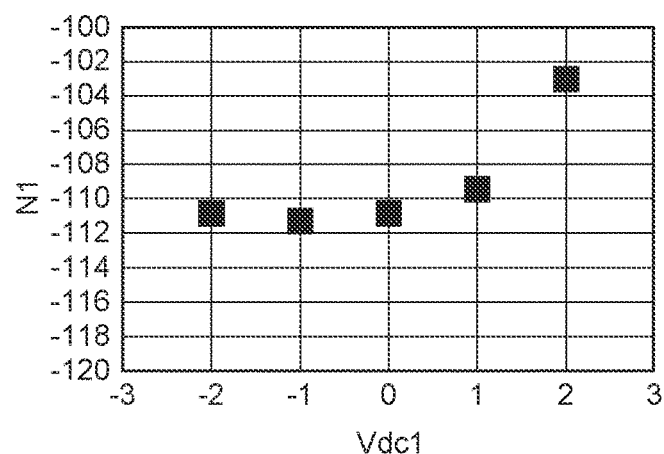
Figure 5C:
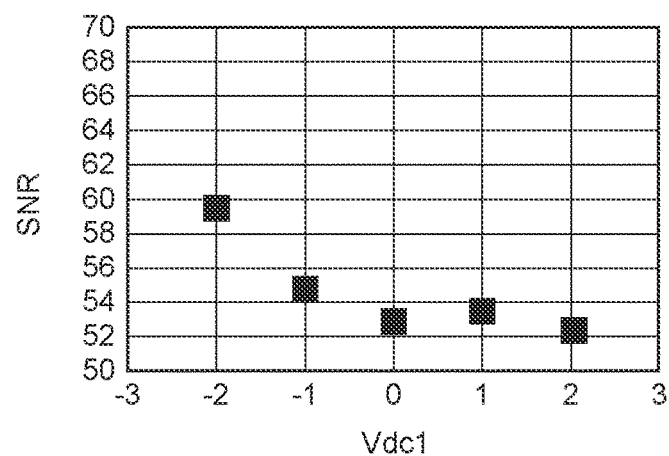
Figure 6A:
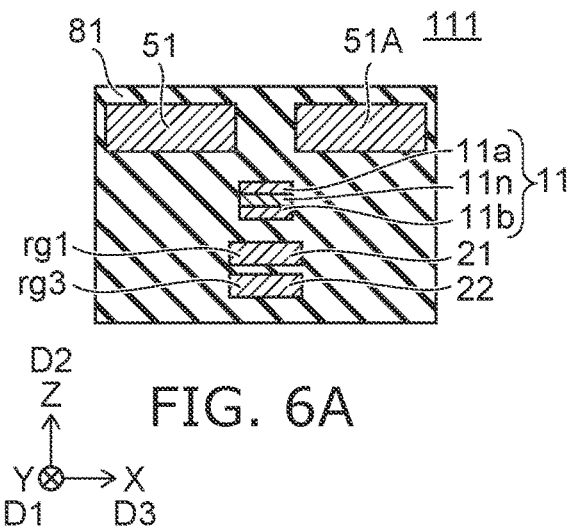
FIGS. 6A to 6D are schematic cross-sectional views illustrating the sensor according to the first embodiment.
Figure 6B:
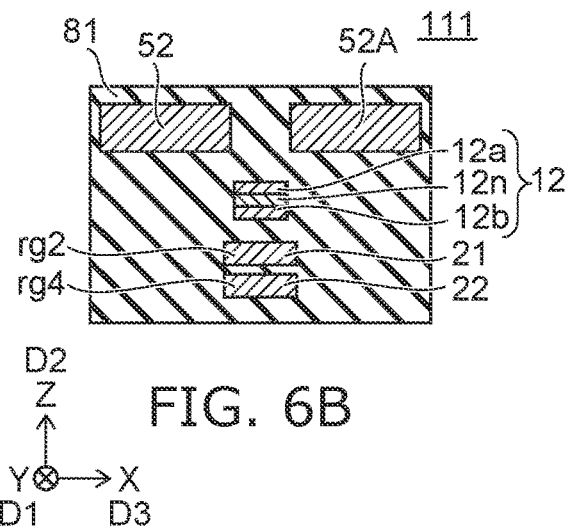
Figure 6C:
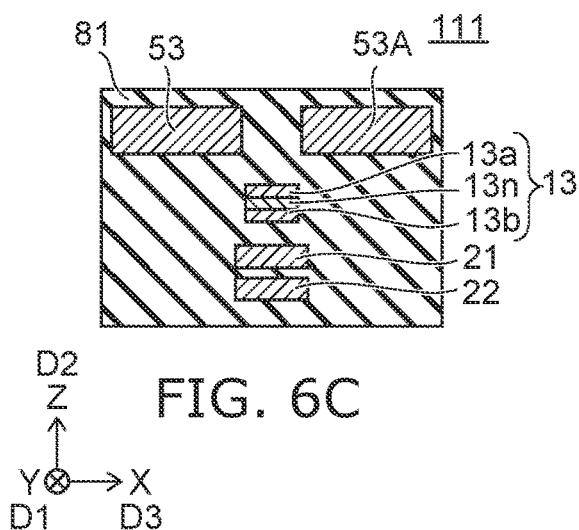
Figure 6D:
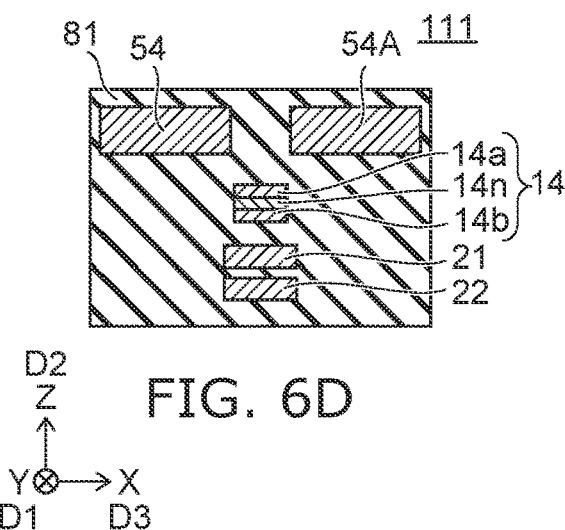

FIGS. 5A to 5C are schematic diagrams illustrating operations in the sensor according to the first embodiment.

The horizontal axis of these figures is the DC voltage Vdc1. The DC voltage Vdc1 corresponds to the DC voltage Vdc by the second circuit 72 (see FIG. 1C). The DC voltage Vdc1 is standardized. The vertical axis of FIG. 5A is the output voltage VR1 of the electrical signal obtained from the first magnetic element 11. The output voltage VR1 corresponds to the first electrical resistance RR1 of the first magnetic element 11. The output voltage VR1 is standardized. The vertical axis in FIG. 5B is the noise intensity N1 in the electric signal obtained from the first magnetic element 11. The noise intensity N1 is standardized. The vertical axis in FIG. 5C is the signal-to-noise ratio (SNR) in the electrical signal obtained from the first magnetic element 11. The SNR is preferably high.

As shown in FIG. 5A, the output voltage VR1 changes symmetrically with respect to the polarity of the DC voltage Vdc1. On the other hand, as shown in FIG. 5B, the noise intensity N1 changes asymmetrically with respect to the polarity of the DC voltage Vdc1. As shown in FIG. 5C, the SNR changes asymmetrically with respect to the polarity of the DC voltage Vdc1. The asymmetric change is thought to be related, for example, to magnetic properties in the magnetic layer. The asymmetric changes may be based on various factors.

By using such characteristics, a detection result with a high SNR can be obtained. In the embodiment, the effect of improving the SNR is obtained by supplying the second current i2 including the DC component to the second conductive member 22.

In the embodiment, the orientation of the second current i2 is set in the same orientation in the regions corresponding to the first magnetic element 11 and the second magnetic element 12.

For example, the second current i2 flows from the third terminal T3 to the fourth terminal T4. For example, the second current i2 flows from the first conductive portion c1e to the first other conductive portion c1f. The second current i2 flows from the second conductive portion c2e to the second other conductive portion c2f.

Alternatively, the second current i2 flows from the fourth terminal T4 to the third terminal T3. For example, the second current i2 flows from the first other conductive portion c1f to the first conductive portion c1e. The second current i2 flows from the second other conductive portion c2f to the second conductive portion c2e.

For example, the first magnetization 11M of the first magnetic layer 11a includes the first component in the first orientation, and the second magnetization 12M of the second magnetic layer 12a includes the second component in the first orientation. The first orientation is along the orientation from the first end portion 11e to the first other end portion 11f or the orientation from the first other end portion 11f to the first end portion 11e.

For example, the first electrical resistance RR1 of the first magnetic element 11 when the second current i2 flows is one of higher and lower than the first electrical resistance RR1 of the first magnetic element 11 when the second current i2 does not flow. At this time, the second electrical resistance RR2 of the second magnetic element 12 when the second current i2 flows is the above one of higher and lower than the second electrical resistance RR2 of the second magnetic element 12 when the second current i2 does not flow.

For example, the first magnetic element 11 is electrically connected in series with the second magnetic element 12. The first electrical resistance RR1 of the first magnetic element 11 when the second current i2 flows through the third region rg3 is one of higher and lower than the first electrical resistance RR1 when the second current i2 does not flow. The second electrical resistance RR2 of the second magnetic element 12 when the second current i2 flows through the fourth region rg4 is the above one of higher and lower than the second electrical resistance RR2 when the second current i2 does not flow.

When the second current i2 flows, the electrical resistance increases in both the first magnetic element 11 and the second magnetic element 12. Alternatively, when the second current i2 flows, the electrical resistance decreases in both the first magnetic element 11 and the second magnetic element 12. In both magnetic elements, the effect of improving SNR is obtained. According to the embodiment, a sensor capable of suppressing noise can be provided.

On the other hand, the first current i1 flows in the opposite orientation in the regions corresponding to the first magnetic element 11 and the second magnetic element 12.

As shown in FIG. 1A, the element portion 10S may further include the third magnetic element 13 and the fourth magnetic element 14.

The third magnetic element 13 includes a third end portion 13e and a third other end portion 13f. A direction from the third end portion 13e to the third other end portion 13f is along the first direction D1. The third end portion 13e is electrically connected to the first end portion 11e.

The fourth magnetic element 14 includes a fourth end portion 14e and a fourth other end portion 14f. The direction from the fourth end portion 14e to the fourth other end portion 14f is along the first direction D1. The third other end portion 13f is electrically connected to the fourth end portion 14e. The fourth other end portion 14f is electrically connected to the second other end portion 12f.

As shown in FIG. 1B, the first conductive member 21 further includes a third portion p3e, a third other portion p3f, a fourth portion p4e, and a fourth other portion p4f. The third portion p3e corresponds to the third end portion 13e. The third other portion p3f corresponds to the third other end portion 13f. The fourth portion p4e corresponds to the fourth end portion 14e. The fourth other portion p4f corresponds to the fourth other end portion 14f.

Third other portion p3f is electrically connected to fourth portion p4e. The third portion p3e is electrically connected to the first portion p1e. The fourth other portion p4f is electrically connected to the second other portion p2f.

As shown in FIG. 1C, the second conductive member 22 further includes a third conductive portion c3e, a third other conductive portion c3f, a fourth conductive portion c4e, and a fourth other conductive portion c4f. The third conductive portion c3e corresponds to the third end portion 13e. The third other conductive portion c3f corresponds to the third other end portion 13f. The fourth conductive portion c4e corresponds to the fourth end portion 14e. The fourth other conductive portion c4f corresponds to the fourth other end portion 14f.

The third other conductive portion c3f is electrically connected to the fourth conductive portion c4e. The third conductive portion c3e is electrically connected to the first conductive portion c1e. The fourth other conductive portion c4f is electrically connected to the second other conductive portion c2f.

As shown in FIG. 1B, the second terminal T2 is electrically connected to the first portion p1e and the second other portion p2f via the third other portion p3f, the third portion p3e, the fourth portion p4e and the fourth other portion p4f.

As shown in FIG. 1C, the third terminal T3 is further electrically connected to the third conductive portion c3e. The fourth terminal T4 is further electrically connected to the fourth other conductive portion c4f.

Figure 2C:
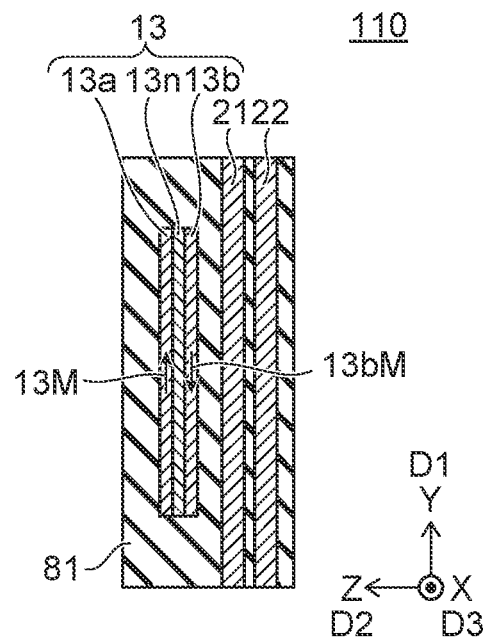
Figure 3C:
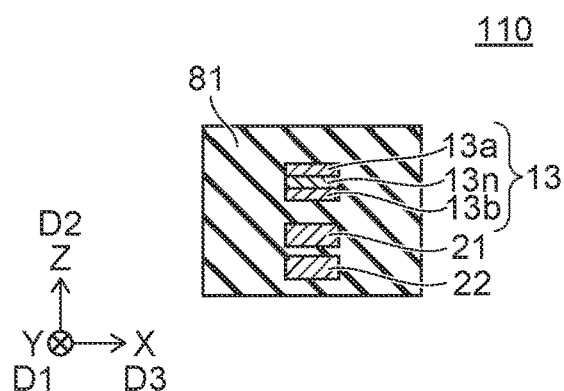

As shown in FIGS. 2C and 3C, a direction from the first conductive member 21 to the third magnetic element 13 and the fourth magnetic element 14 is along the second direction D2. The third magnetic element 13 includes a third magnetic layer 13a. The third magnetization 13M of the third magnetic layer 13a includes a third component in the first orientation. In this example, the third magnetic element 13 further includes a third opposing magnetic layer 13b and a third non-magnetic layer 13n. The third non-magnetic layer 13n is located between the third magnetic layer 13a and the third opposing magnetic layer 13b. For example, the third magnetic layer 13a is a magnetization reference layer, and the third opposing magnetic layer 13b is a magnetization free layer. The magnetization 13bM of the third opposing magnetic layer 13b changes more easily than the third magnetization 13M.

Figure 2D:
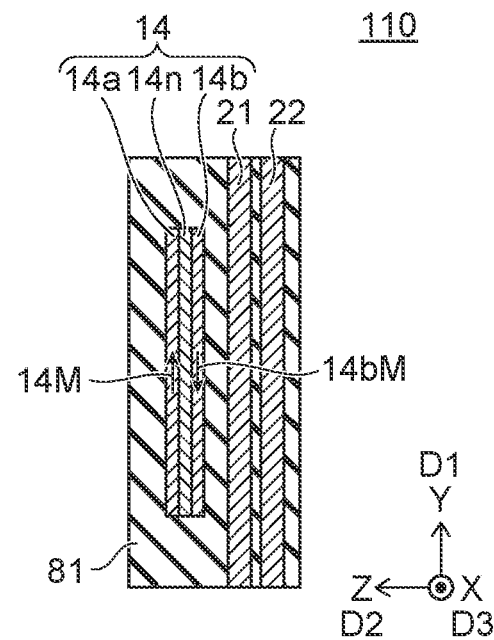
Figure 3D:
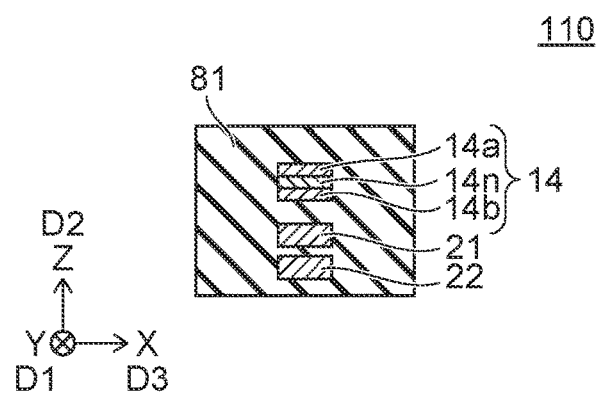

As shown in FIGS. 2D and 3D, a direction from the second conductive member 22 to the third magnetic element 13 and the fourth magnetic element 14 is along the second direction D2. The fourth magnetic element 14 includes a fourth magnetic layer 14a. The fourth magnetization 14M of the fourth magnetic layer 14a includes the fourth component in the first orientation. In this example, the fourth magnetic element 14 further includes a fourth opposing magnetic layer 14b and a fourth non-magnetic layer 14n. The fourth non-magnetic layer 14n is located between the fourth magnetic layer 14a and the fourth opposing magnetic layer 14b. For example, the fourth magnetic layer 14a is a magnetization reference layer, and the fourth opposing magnetic layer 14b is a magnetization free layer. The magnetization 14bM of the fourth opposing magnetic layer 14b changes more easily than the fourth magnetization 14M.

As shown in FIG. 1B, the first circuit 71 configured to supply the first current i1 to the first conductive member 21 is provided. The second circuit 72 configured to supply the second current i2 to the second conductive member 22 is provided.

As shown in FIG. 1A, the third circuit 73 and the fourth circuit 74 are provided. The third circuit 73 is configured to supply the detection voltage Vs or the detection current between the first connection point CP1 and the second connection point CP2. The first connection point CP1 is electrically connected to the first end portion 11e (and the third end portion 13e). The second connection point CP2 is electrically connected to the second other end portion 12f (and the fourth other end portion 14f).

The fourth circuit 74 is configured to output a value corresponding to the change in the potential difference between the third connection point CP3 of the first other end portion 11f and the second end portion 12e and the fourth connection point CP4 of the third other end portion 13f and the fourth end portion 14e.

By the bridge circuit including four magnetic elements, highly accurate detection with more suppressed noise can be possible.

For example, the distance between the first portion p1e and the first end portion 11e is shorter than the distance between the first portion p1e and the first other end portion 11f, and shorter than the distance between the first other portion p1f and the first end portion 11e. For example, the distance between the first other portion p1f and the first other end portion 11f is shorter than the distance between the first portion p1e and the first other end portion 11f, and shorter than the distance between the first other portion p1f and the first end portion 11e.

For example, the distance between the second portion p2e and the second end portion 12e is shorter than the distance between the second portion p2e and the second other end portion 12f, and shorter than the distance between the second other portion p2f and the second end portion 12e. For example, the distance between the second other portion p2f and the second other end portion 12f is shorter than the distance between the second portion p2e and the second other end portion 12f, and shorter than the distance between the second other portion p2f and the second end portion 12e.

For example, the distance between the first conductive portion c1e and the first end portion 11e is shorter than the distance between the first conductive portion c1e and the first other end portion 11f, and shorter than the distance between the first other conductive portion c1f and the first end portion 11e. For example, the distance between the first other conductive portion c1f and the first other end portion 11f is shorter than the distance between the first conductive portion c1e and the first other end portion 11f, and shorter than the distance between the first other conductive portion c1f and the first end portion 11e.

For example, the distance between the second conductive portion c2e and the second end portion 12e is shorter than the distance between the second conductive portion c2e and the second other end portion 12f, and shorter than the distance between the second other conductive portion c2f and the second end portion 12e. For example, the distance between the second other conductive portion c2f and the second other end portion 12f is shorter than the distance between the second conductive portion c2e and the second other end portion 12f, and shorter than the distance between the second other conductive portion c2f and the second end portion 12e.

For example, the distance between the third portion p3e and the third end portion 13e is shorter than the distance between the third portion p3e and the third other end portion 13f, and shorter than the distance between the third other portion p3f and the third end portion 13e. The distance between the third other portion p3f and the third other end portion 13f is shorter than the distance between the third portion p3e and the third other end portion 13f, and shorter than the distance between the third other portion p3f and the third end portion 13e.

For example, the distance between the fourth portion p4e and the fourth end portion 14e is shorter than the distance between the fourth portion p4e and the fourth other end portion 14f, and shorter than the distance between the fourth other portion p4f and the fourth end portion 14e. For example, the distance between the fourth other portion p4f and the fourth end portion 14e is shorter than the distance between the fourth portion p4e and the fourth other end portion 14f, and shorter than the distance between the fourth other portion p4f and the fourth end portion 14e.

For example, the distance between the third conductive portion c3e and the third end portion 13e is shorter than the distance between the third conductive portion c3e and the third other end portion 13f, and shorter than the distance between the third other conductive portion c3f and the third end portion 13e. For example, the distance between the third other conductive portion c3f and the third other end portion 13f is shorter than the distance between the third conductive portion c3e and the third other end portion 13f, and shorter than the distance between the third other conductive portion c3f and the third end portion 13e.

For example, the distance between the fourth conductive portion c4e and the fourth end portion 14e is shorter than the distance between the fourth conductive portion c4e and the fourth other end portion 14f, and shorter than the distance between the fourth other conductive portion c4f and the fourth end portion 14e. For example, the distance between the fourth other conductive portion c4f and the fourth other end portion 14f is shorter than the distance between the fourth conductive portion c4e and the fourth other end portion 14f, and shorter than the distance between the fourth other conductive portion c4f and the fourth end portion 14e.

In the embodiment, the first conductive member 21 may be located between the second conductive member 22 and the first magnetic element 11. The second conductive member 22 may be located between the first conductive member 21 and the first magnetic element 11. An arbitrary configuration may be applied to obtain the effect of improving the SNR by the second current i2 supplied to the second conductive member 22. For example, even when one magnetic element is provided, the effect of improving SNR can be obtained.

FIGS. 6A to 6D are schematic cross-sectional views illustrating the sensor according to the first embodiment.

As shown in FIGS. 6A to 6D, in a sensor 111 according to the embodiment, the element portion 10S includes a first magnetic portion 51, a first opposing magnetic portion 51A, a second magnetic portion 52, a second opposing It includes a magnetic portion 52A, a third magnetic portion 53, a third opposing magnetic portion 53A, a fourth magnetic portion 54, and a fourth opposing magnetic portion 54A.

A direction from the first magnetic portion 51 to the first opposing magnetic portion 51A is along the third direction D3. The position of at least a part of the first magnetic element 11 in the third direction D3 is between the position of the first magnetic portion 51 in the third direction D3 and the position of the first opposing magnetic portion 51A in the third direction D3.

A direction from the second magnetic portion 52 to the second opposing magnetic portion 52A is along the third direction D3. The position of at least a part of the second magnetic element 12 in the third direction D3 is between the position of the second magnetic portion 52 in the third direction D3 and the position of the second opposing magnetic portion 52A in the third direction D3.

A direction from the third magnetic portion 53 to the third opposing magnetic portion 53A is along the third direction D3. The position of at least a part of the third magnetic element 13 in the third direction D3 is between the position of the third magnetic portion 53 in the third direction D3 and the position of the third opposing magnetic portion 53A in the third direction D3.

A direction from the fourth magnetic portion 54 to the fourth opposing magnetic portion 54A is along the third direction D3. The position of at least a part of the fourth magnetic element 14 in the third direction D3 is between the position of the fourth magnetic portion 54 in the third direction D3 and the position of the fourth opposing magnetic portion 54A in the third direction D3.

The magnetic field collected by the magnetic member and the opposing magnetic member is applied to the magnetic elements. Efficient detection is possible. These magnetic members and opposing magnetic members function as, for example, MFC (Magnetic Flux Concentrator).

Second Embodiment

The second embodiment relates to an inspection device. As will be described later, the inspection device may include a diagnostic device.

Figure 7:
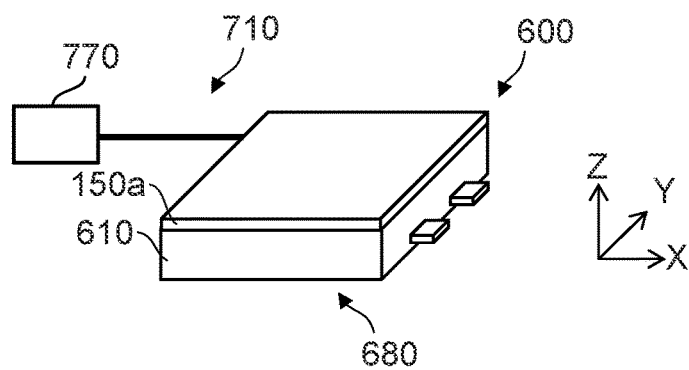
FIG. 7 is a schematic perspective view illustrating an inspection device according to a second embodiment.

FIG. 7 is a schematic perspective view illustrating an inspection device according to a second embodiment.

As shown in FIG. 7, an inspection device 710 according to the embodiment includes a sensor 150a (magnetic sensor) and a processor 770. The sensor 150a may be the sensor according to the first embodiment and a modification thereof. The processor 770 processes an output signal obtained from the sensor 150a. The processor 770 may compare the signal obtained from the sensor 150a with the reference value. The processor 770 can output the inspection result based on the processing result.

For example, the inspection device 710 inspects an inspection object 680. The inspection object 680 is, for example, an electronic device (including a semiconductor circuit or the like). The inspection object 680 may be, for example, a battery 610 or the like.

For example, the sensor 150a according to the embodiment may be used together with the battery 610. For example, a battery system 600 includes the battery 610 and the sensor 150a. The sensor 150a can detect the magnetic field generated by the current flowing through the battery 610.

Figure 8:
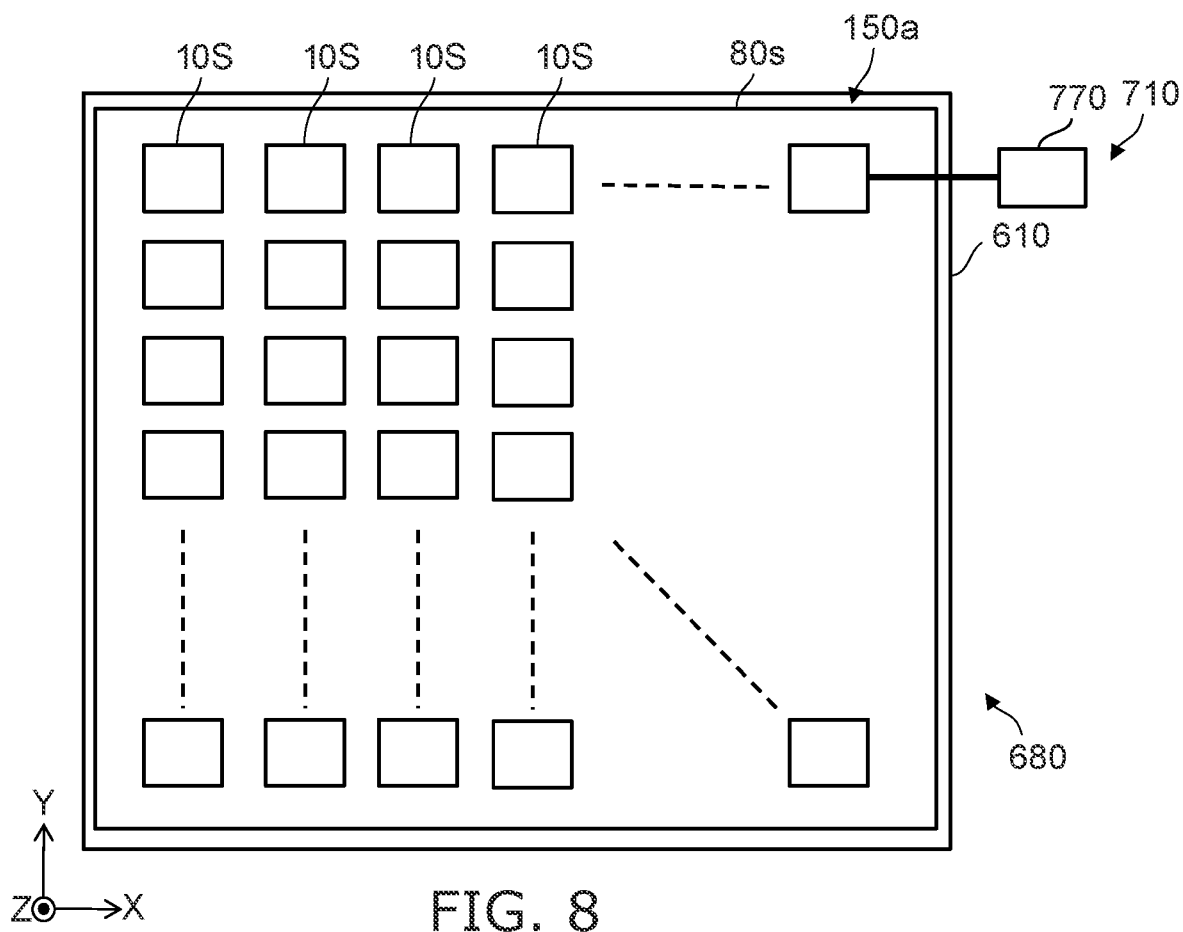
FIG. 8 is a schematic plan view illustrating the inspection device according to the second embodiment.

FIG. 8 is a schematic plan view illustrating the inspection device according to the second embodiment.

As shown in FIG. 8, the sensor 150a includes, for example, multiple sensors according to the embodiment. In this example, the sensor 150a includes multiple sensors (the element portion 10U such as the sensor 110, etc.). The multiple sensors are arranged along, for example, two directions (for example, the X-axis direction and the Y-axis direction). The multiple sensors 110 are provided, for example, on a substrate.

The sensor 150a can detect the magnetic field generated by the current flowing through the inspection object 680 (for example, the battery 610 may be used). For example, when the battery 610 approaches an abnormal state, an abnormal current may start to flow through the battery 610. By detecting the abnormal current with the sensor 150a, it is possible to know the change in the state of the battery 610. For example, in a state where the sensor 150a is placed close to the battery 610, the entire battery 610 can be inspected in a short time by moving the sensor array in two directions. The sensor 150a may be used for inspection of the battery 610 in manufacturing process of the battery 610.

The sensor according to the embodiment can be applied to, for example, the inspection device 710 such as a diagnostic device.

Figure 9:
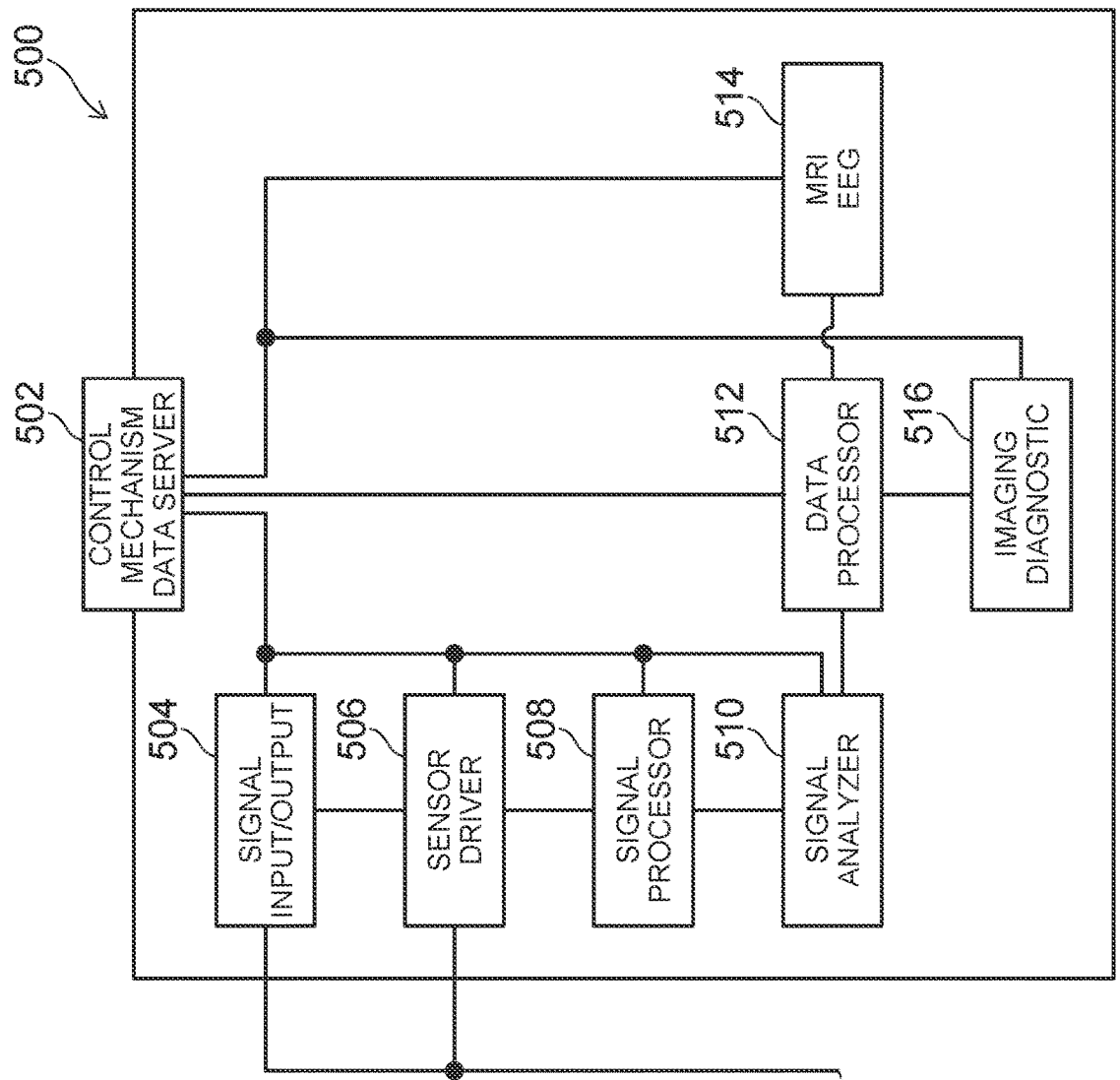
FIG. 9 is a schematic diagram illustrating the sensor and the inspection device according to the embodiment.
Figure 9:
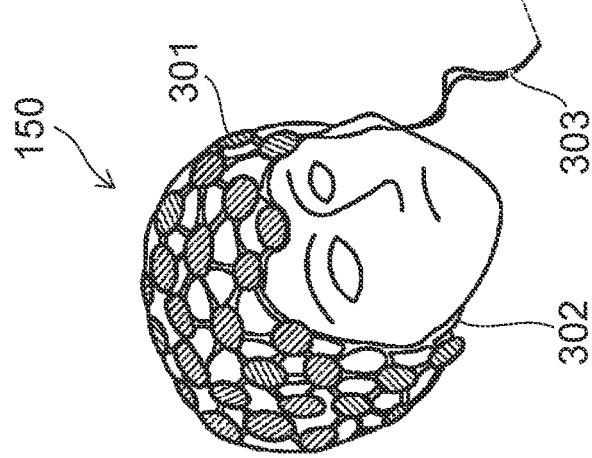

FIG. 9 is a schematic diagram illustrating the sensor and the inspection device according to the embodiment.

As shown in FIG. 9, a diagnostic apparatus 500, which is an example of the inspection device 710, includes a sensor 150. The sensor 150 includes the sensors described with respect to the first embodiment and modifications thereof.

In the diagnostic apparatus 500, the sensor 150 is, for example, a magnetoencephalograph. The magnetoencephalograph detects the magnetic field generated by the cranial nerves. When the sensor 150 is used in a magnetoencephalograph, the size of the magnetic element included in the sensor 150 is, for example, not less than 1 mm and less than 10 mm. This size is, for example, the length including an MFC.

As shown in FIG. 9, the sensor 150 (magnetoencephalogram) is attached to, for example, the head of a human body. The sensor 150 (magnetoencephalogram) includes a sensor part 301. The sensor 150 (magnetoencephalogram) may include multiple sensor parts 301. The number of the multiple sensor parts 301 is, for example, about 100 (for example, not less than 50 and not more than 150). The multiple sensor parts 301 are provided on a flexible base body 302.

The sensor 150 may include, for example, a circuit such as differential detection. The sensor 150 may include a sensor other than the sensor (for example, a potential terminal or an acceleration sensor).

A size of the sensor 150 is smaller than a size of a conventional SQUID sensor. Therefore, it is easy to install the multiple sensor parts 301. Installation of the multiple sensor parts 301 and other circuits is easy. The coexistence of the multiple sensor parts 301 and other sensors is easy.

The base body 302 may include an elastic body such as a silicone resin. For example, the multiple sensor parts 301 are provided to be connected to the base body 302. The base body 302 can be in close contact with the head, for example.

The input/output code 303 of the sensor part 301 is connected to a sensor driver 506 and a signal input/output 504 of the diagnostic apparatus 500. The magnetic field measurement is performed in the sensor part 301 based on the electric power from the sensor driver 506 and the control signal from the signal input/output 504. The result is input to the signal input/output 504. The signal obtained by the signal input/output 504 is supplied to a signal processor 508. The signal processor 508 performs processing such as noise removal, filtering, amplification, and signal calculation. The signal processed by the signal processor 508 is supplied to a signal analyzer 510. The signal analyzer 510 extracts, for example, a specific signal for magnetoencephalography measurement. In the signal analyzer 510, for example, signal analysis for matching signal phases is performed.

The output of the signal analyzer 510 (data for which signal analysis has been completed) is supplied to a data processor 512. The data processor 512 performs data analysis. In this data analysis, for example, image data such as MRI (Magnetic Resonance Imaging) can be incorporated. In this data analysis, for example, scalp potential information such as EEG (Electroencephalogram) can be incorporated. For example, a data part 514 such as MRI or EEG is connected to the data processor 512. By the data analysis, for example, nerve ignition point analysis, inverse problem analysis, and the like are performed.

The result of the data analysis is supplied to, for example, an imaging diagnostic 516. Imaging is performed in the imaging diagnostic 516. Imaging assists in diagnosis.

The above series of operations is controlled by, for example, a control mechanism 502. For example, necessary data such as primary signal data or metadata in the middle of data processing is stored in the data server. The data server and the control mechanism may be integrated.

The diagnostic apparatus 500 according to the embodiment includes the sensor 150 and the processor that processes an output signal obtained from the sensor 150. This processor includes, for example, at least one of a signal processor 508 or a data processor 512. The processor includes, for example, a computer.

In the sensor 150 shown in FIG. 9, the sensor part 301 is installed on the head of the human body. The sensor part 301 may be installed on the chest of the human body. This enables magnetocardiography measurement. For example, the sensor part 301 may be installed on the abdomen of a pregnant woman. This makes it possible to perform a fetal heartbeat test.

The sensor device including the subject is preferably installed in a shield room. Thereby, for example, the influence of geomagnetism or magnetic noise can be suppressed.

For example, a mechanism for locally shielding the measurement site of the human body or the sensor part 301 may be provided. For example, the sensor part 301 may be provided with a shield mechanism. For example, effective shielding may be performed in the signal analysis or the data processing.

In embodiments, the base body 302 may be flexible and may be substantially non-flexible. In the example shown in FIG. 9, the base body 302 is a continuous film processed into a hat shape. The base body 302 may be in a net shape. Thereby, for example, good wearability can be obtained. For example, the adhesion of the base body 302 to the human body is improved. The base body 302 may be helmet-shaped and may be rigid.

Figure 10:
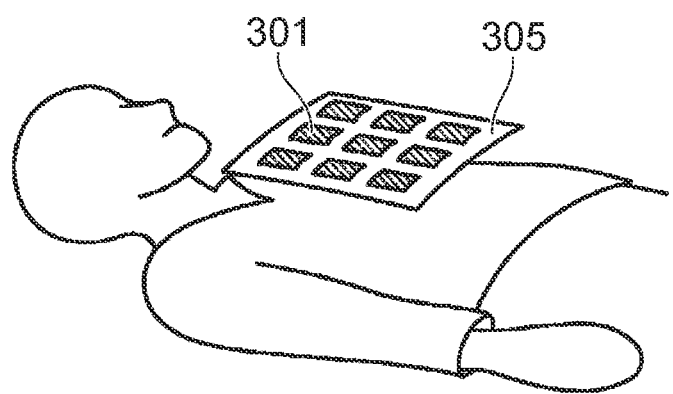
FIG. 10 is a schematic view illustrating the inspection device according to the embodiment.

FIG. 10 is a schematic view illustrating the inspection device according to the embodiment.

In the example shown in FIG. 10, the sensor part 301 is provided on a flat plate-shaped hard base body 305.

In the example shown in FIG. 10, the input/output of the signal obtained from the sensor part 301 is the same as the input/output described with respect to FIG. 9. In the example shown in FIG. 10, the processing of the signal obtained from the sensor part 301 is the same as the processing described with respect to FIG. 9.

There is a reference example of using a SQUID (Superconducting Quantum Interference Device) sensor as a device for measuring a weak magnetic field such as a magnetic field generated from a living body. In this reference example, since superconductivity is used, the device is large and the power consumption is also large. The burden on the measurement target (patient) is heavy.

According to the embodiment, the device can be downsized. Power consumption can be suppressed. The burden on the measurement object (patient) can be reduced. According to the embodiment, the SN ratio of magnetic field detection can be improved. Sensitivity can be improved.

The embodiments may include the following configurations (for example, technical proposals).

Configuration 1

A sensor, comprising:
an element portion, the element portion including:
a first magnetic element including a first end portion and a first other end portion, a direction from the first end portion to the first other end portion being along a first direction;
a second magnetic element including a second end portion and a second other end portion, a direction from the second end portion to the second other end portion being along the first direction, the first other end portion being electrically connected to the second end portion;
a first conductive member including a first portion, a first other portion, a second portion, and a second other portion, the first portion corresponding to the first end portion, the first other portion corresponding to the first other end portion, the second portion corresponding to the second end portion, the second other portion corresponding to the second other end portion, the first other portion being electrically connected to the second portion; and
a second conductive member including a first conductive portion, a first other conductive portion, a second conductive portion, and a second other conductive portion, the first conductive portion corresponding to the first end portion, the first other conductive portion corresponding to the first other end portion, the second conductive portion corresponding to the second end portion, the second other conductive portion corresponding to the second other end portion, the first other conductive portion being electrically connected to the second conductive portion.

Configuration 2

The sensor according to Configuration 1, wherein
a second direction from the first conductive member to the first magnetic element and the second magnetic element crosses the first direction, and
a direction from the second conductive member to the first magnetic element and the second magnetic element is along the second direction.

Configuration 3

The sensor according to Configuration 2, wherein
the element portion includes:
  a first terminal electrically connected to the first other portion and the second portion,
  a second terminal electrically connected to the first portion and the second other portion,
  a third terminal electrically connected to the first conductive portion, and
  a fourth terminal electrically connected to the second conductive portion,
a first current including an AC component is configured to be supplied between the first terminal and the second terminal,
a second current including a DC component is configured to be supplied between the third terminal and the fourth terminal, and
when the first current flows from the first terminal to the second terminal, the second current flows from the third terminal to the fourth terminal or from the fourth terminal to the third terminal.

Configuration 4

The sensor according to Configuration 3, wherein
the first magnetic element includes a first magnetic layer,
a first magnetization of the first magnetic layer includes a first component in a first orientation,
the first orientation is along an orientation from the first end portion to the first other end portion or an orientation from the first other end portion to the first end portion;
the second magnetic element includes a second magnetic layer, and
a second magnetization of the second magnetic layer includes a second component in the first orientation.

Configuration 5

The sensor according to Configuration 3 or 4, further comprising:
a first circuit configured to supply the first current to the first conductive member; and
a second circuit configured to supply the second current to the second conductive member.

Configuration 6

The sensor according to Configuration 5, further comprising:
a third circuit; and
a fourth circuit,
the third circuit being configured to supply a detection voltage or a detection current between a first connection point electrically connected to the first end portion and a second connection point electrically connected to the second other end portion, and
the fourth circuit being configured to output a value corresponding to a change in a potential at a third connection point of the first other end portion and the second end portion.

Configuration 7

The sensor according to Configuration 4, wherein
the element portion further includes:
  a third magnetic element, and
  a fourth magnetic element,
the third magnetic element includes a third end portion and a third other end portion,
a direction from the third end portion to the third other end portion is along the first direction,
the third end portion is electrically connected to the first end portion,
the fourth magnetic element includes a fourth end portion and a fourth other end portion,
a direction from the fourth end portion to the fourth other end portion is along the first direction,
the third other end portion is electrically connected to the fourth end portion,
the fourth other end portion is electrically connected to the second other end portion,
the first conductive member further includes a third portion, a third other portion, a fourth portion, and a fourth other portion,
the third portion corresponds to the third end portion, the third other portion corresponds to the third other end portion, the fourth portion corresponds to the fourth end portion, and the fourth other portion corresponds to the fourth other end portion,
the third other portion is electrically connected to the fourth portion,
the third portion is electrically connected to the first portion,
the fourth other portion is electrically connected to the second other portion,
the second conductive member further includes a third conductive portion, a third other conductive portion, a fourth conductive portion, and a fourth other conductive portion, the third conductive portion corresponds to the third end portion, the third other conductive portion corresponds to the third other end portion, the fourth conductive portion corresponds to the fourth end portion, and the fourth other conductive portion corresponds to the fourth other end portion, the third other conductive portion is electrically connected to the fourth conductive portion, the third conductive portion is electrically connected to the first conductive portion, and the fourth other conductive portion is electrically connected to the second other conductive portion.

Configuration 8

The sensor according to Configuration 7, wherein
a direction from the first conductive member to the third magnetic element and the fourth magnetic element is along the second direction, and
a direction from the second conductive member to the third magnetic element and the fourth magnetic element is along the second direction.

Configuration 9

The sensor according to Configuration 8, wherein
the second terminal is electrically connected to the first portion and the second other portion via the third other portion, the third portion, the fourth portion, and the fourth other portion,
the third terminal is further electrically connected to the third conductive portion, and
the fourth terminal is further electrically connected to the fourth other conductive portion.

Configuration 10

The sensor according to Configuration 8, wherein
the third magnetic element includes a third magnetic layer,
a third magnetization of the third magnetic layer includes a third component in the first orientation,
the fourth magnetic element includes a fourth magnetic layer, and
a fourth magnetization of the fourth magnetic layer includes a fourth component in the first orientation.

Configuration 11

The sensor according to any one of Configurations 7 to 10, further comprising:
a first circuit configured to supply the first current to the first conductive member; and
a second circuit configured to supply the second current to the second conductive member.

Configuration 12

The sensor according to Configuration 11, further comprising:
a third circuit; and
a fourth circuit,
the third circuit being configured to supply a detection voltage or a detection current between a first connection point electrically connected to the first end and a second connection point electrically connected to the second end, and the fourth circuit being configured to output a value corresponding to a change in a potential difference between a third connection point of the first end portion and the second end portion, and a fourth connection point of the third end portion and the fourth end portion.

Configuration 13

The sensor according to Configuration 4, wherein
a first electrical resistance of the first magnetic element when the second current flows is one of higher and lower than the first electrical resistance when the second current does not flow, and
a second electrical resistance of the second magnetic element when the second current flows is the one of higher and lower than the second electrical resistance when the second current does not flow.

Configuration 14

The sensor according to any one of Configurations 2 to 4, wherein
a first electrical resistance of the first magnetic element is configured to be changed according to a detection target magnetic field, and
a second electrical resistance of the second magnetic element is configured to be changed in accordance with the detection target magnetic field.

Configuration 15

The sensor according to Configuration 14, wherein the detection target magnetic field includes a component along a third direction crossing a plane including the first direction and the second direction.

Configuration 16

The sensor according to any one of Configurations 1 to 15, wherein
a distance between the first portion and the first end portion is shorter than a distance between the first portion and the first other end portion, and is shorter than a distance between the first other portion and the first end portion, and
a distance between the first conductive portion and the first end portion is shorter than the distance between the first conductive portion and the first other end portion, and shorter than a distance between the first other conductive portion and the first end portion.

Configuration 17

A sensor, comprising:
an element portion, the element portion including:
a first magnetic element,
a second magnetic element,
a first conductive member including a first region overlapping the first magnetic element and a second region overlapping the second magnetic element, and
a second conductive member including a third region overlapping the first magnetic element and a fourth region overlapping the second magnetic element,
a first current being configured to be supplied to the first conductive member, a second current being configured to be supplied to the second conductive member, and when an orientation of the first current flowing in the first region is same as an orientation of the second current flowing in the third region, an orientation of the first current flowing in the second region being opposite to an orientation of the second current flowing in the fourth region.

Configuration 18

The sensor according to Configuration 17, wherein
the first magnetic element is electrically connected in series with the second magnetic element,
a first electrical resistance of the first magnetic element when the second current flows through the third region is one of higher and lower than the first electrical resistance when the second current does not flow, and
a second electrical resistance of the second magnetic element when the second current flows through the fourth region is the one of higher and lower than the second electrical resistance when the second current does not flow.

Configuration 19

The sensor according to Configuration 17 or 18, wherein
the first magnetic element includes a first magnetic layer,
the second magnetic element includes a second magnetic layer, and
a first magnetization of the first magnetic layer has same orientation as a second magnetization of the second magnetic layer.

Configuration 20

An inspection device, comprising:
the sensor according to any one of Configurations 1 to 19; and
a processor configured to process an output signal obtained from the sensor.

According to the embodiments, it is possible to provide a sensor and an inspection device capable of improving sensitivity.

In the present specification, "perpendicular" and "parallel" include not only strict perpendicularity and strict parallelism, but also variations in the manufacturing process, for example, and may be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the sensors such as element portions, magnetic elements, magnetic layers, non-magnetic layers, conductive members, conductive layers circuit, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors and all inspection devices practicable by an appropriate design modification by one skilled in the art based on the sensors and the inspection devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A sensor, comprising:
an element portion, the element portion including:
a first magnetic element including a first end portion and a first other end portion, a direction from the first end portion to the first other end portion being along a first direction;
a second magnetic element including a second end portion and a second other end portion, a direction from the second end portion to the second other end portion being along the first direction, the first other end portion being electrically connected to the second end portion;
a first conductive member including a first portion, a first other portion, a second portion, and a second other portion, the first portion corresponding to the first end portion, the first other portion corresponding to the first other end portion, the second portion corresponding to the second end portion, the second other portion corresponding to the second other end portion, the first other portion being electrically connected to the second portion; and
a second conductive member including a first conductive portion, a first other conductive portion, a second conductive portion, and a second other conductive portion, the first conductive portion corresponding to the first end portion, the first other conductive portion corresponding to the first other end portion, the second conductive portion corresponding to the second end portion, the second other conductive portion corresponding to the second other end portion, the first other conductive portion being electrically connected to the second conductive portion.

2. The sensor according to claim 1, wherein
a second direction from the first conductive member to the first magnetic element and the second magnetic element crosses the first direction, and
a direction from the second conductive member to the first magnetic element and the second magnetic element is along the second direction.

3. The sensor according to claim 2, wherein
the element portion includes:
a first terminal electrically connected to the first other portion and the second portion,
a second terminal electrically connected to the first portion and the second other portion, a third terminal electrically connected to the first conductive portion, and
a fourth terminal electrically connected to the second conductive portion,
a first current including an AC component is configured to be supplied between the first terminal and the second terminal,
a second current including a DC component is configured to be supplied between the third terminal and the fourth terminal, and
when the first current flows from the first terminal to the second terminal, the second current flows from the third terminal to the fourth terminal or from the fourth terminal to the third terminal.

4. The sensor according to claim 3, wherein
the first magnetic element includes a first magnetic layer,
a first magnetization of the first magnetic layer includes a first component in a first orientation,
the first orientation is along an orientation from the first end portion to the first other end portion or an orientation from the first other end portion to the first end portion;
the second magnetic element includes a second magnetic layer, and
a second magnetization of the second magnetic layer includes a second component in the first orientation.

5. The sensor according to claim 4, wherein
the element portion further includes:
a third magnetic element, and
a fourth magnetic element,
the third magnetic element includes a third end portion and a third other end portion,
a direction from the third end portion to the third other end portion is along the first direction,
the third end portion is electrically connected to the first end portion,
the fourth magnetic element includes a fourth end portion and a fourth other end portion,
a direction from the fourth end portion to the fourth other end portion is along the first direction,
the third other end portion is electrically connected to the fourth end portion,
the fourth other end portion is electrically connected to the second other end portion,
the first conductive member further includes a third portion, a third other portion, a fourth portion, and a fourth other portion,
the third portion corresponds to the third end portion, the third other portion corresponds to the third other end portion, the fourth portion corresponds to the fourth end portion, and the fourth other portion corresponds to the fourth other end portion,
the third other portion is electrically connected to the fourth portion,
the third portion is electrically connected to the first portion,
the fourth other portion is electrically connected to the second other portion,
the second conductive member further includes a third conductive portion, a third other conductive portion, a fourth conductive portion, and a fourth other conductive portion,
the third conductive portion corresponds to the third end portion, the third other conductive portion corresponds to the third other end portion, the fourth conductive portion corresponds to the fourth end portion, and the fourth other conductive portion corresponds to the fourth other end portion,
the third other conductive portion is electrically connected to the fourth conductive portion,
the third conductive portion is electrically connected to the first conductive portion, and
the fourth other conductive portion is electrically connected to the second other conductive portion.

6. The sensor according to claim 5, wherein
a direction from the first conductive member to the third magnetic element and the fourth magnetic element is along the second direction, and
a direction from the second conductive member to the third magnetic element and the fourth magnetic element is along the second direction.

7. The sensor according to claim 6, wherein
the second terminal is electrically connected to the first portion and the second other portion via the third other portion, the third portion, the fourth portion, and the fourth other portion,
the third terminal is further electrically connected to the third conductive portion, and
the fourth terminal is further electrically connected to the fourth other conductive portion.

8. The sensor according to claim 6, wherein
the third magnetic element includes a third magnetic layer,
a third magnetization of the third magnetic layer includes a third component in the first orientation,
the fourth magnetic element includes a fourth magnetic layer, and
a fourth magnetization of the fourth magnetic layer includes a fourth component in the first orientation.

9. The sensor according to claim 5, further comprising:
a first circuit configured to supply the first current to the first conductive member; and
a second circuit configured to supply the second current to the second conductive member.

10. The sensor according to claim 9, further comprising:
a third circuit; and
a fourth circuit,
the third circuit being configured to supply a detection voltage or a detection current between a first connection point electrically connected to the first end and a second connection point electrically connected to the second end, and
the fourth circuit being configured to output a value corresponding to a change in a potential difference between a third connection point of the first end portion and the second end portion, and a fourth connection point of the third end portion and the fourth end portion.

11. The sensor according to claim 4, wherein
a first electrical resistance of the first magnetic element when the second current flows is one of higher and lower than the first electrical resistance when the second current does not flow, and
a second electrical resistance of the second magnetic element when the second current flows is the one of higher and lower than the second electrical resistance when the second current does not flow.

12. The sensor according to claim 3, further comprising:
a first circuit configured to supply the first current to the first conductive member; and
a second circuit configured to supply the second current to the second conductive member.

13. The sensor according to claim 12, further comprising:
a third circuit; and
a fourth circuit,
the third circuit being configured to supply a detection voltage or a detection current between a first connection point electrically connected to the first end portion and a second connection point electrically connected to the second other end portion, and
the fourth circuit being configured to output a value corresponding to a change in a potential at a third connection point of the first other end portion and the second end portion.

14. The sensor according to claim 2, wherein
a first electrical resistance of the first magnetic element is configured to be changed according to a detection target magnetic field, and
a second electrical resistance of the second magnetic element is configured to be changed in accordance with the detection target magnetic field.

15. The sensor according to claim 14, wherein the detection target magnetic field includes a component along a third direction crossing a plane including the first direction and the second direction.

16. The sensor according to claim 1, wherein
a distance between the first portion and the first end portion is shorter than a distance between the first portion and the first other end portion, and is shorter than a distance between the first other portion and the first end portion, and
a distance between the first conductive portion and the first end portion is shorter than the distance between the first conductive portion and the first other end portion, and shorter than a distance between the first other conductive portion and the first end portion.

17. An inspection device, comprising:
the sensor according to claim 1; and
a processor configured to process an output signal obtained from the sensor.

18. A sensor, comprising:
an element portion, the element portion including:
a first magnetic element,
a second magnetic element,
a first conductive member including a first region overlapping the first magnetic element and a second region overlapping the second magnetic element, and
a second conductive member including a third region overlapping the first magnetic element and a fourth region overlapping the second magnetic element,
a first current being configured to be supplied to the first conductive member,
a second current being configured to be supplied to the second conductive member, and
when an orientation of the first current flowing in the first region is same as an orientation of the second current flowing in the third region, an orientation of the first current flowing in the second region being opposite to an orientation of the second current flowing in the fourth region.

19. The sensor according to claim 18, wherein
the first magnetic element is electrically connected in series with the second magnetic element,
a first electrical resistance of the first magnetic element when the second current flows through the third region is one of higher and lower than the first electrical resistance when the second current does not flow, and
a second electrical resistance of the second magnetic element when the second current flows through the fourth region is the one of higher and lower than the second electrical resistance when the second current does not flow.

20. The sensor according to claim 18, wherein
the first magnetic element includes a first magnetic layer,
the second magnetic element includes a second magnetic layer, and
a first magnetization of the first magnetic layer has same orientation as a second magnetization of the second magnetic layer.

* * * * *